United States Patent
Garbuzov et al.

(10) Patent No.: US 6,650,671 B1
(45) Date of Patent: Nov. 18, 2003

(54) SEMICONDUCTOR DIODE LASERS WITH IMPROVED BEAM DIVERGENCE

(75) Inventors: Dmitri Zalmanovich Garbuzov, Princeton, NJ (US); Viktor Borisovich Khalfin, Hightstown, NJ (US); John Charles Connolly, Clarksburg, NJ (US)

(73) Assignee: Trumpf Photonics, Inc., Cranbury, NJ (US)

(*) Notice: Subject to any disclaimer, the term of this patent is extended or adjusted under 35 U.S.C. 154(b) by 0 days.

(21) Appl. No.: 09/553,551

(22) Filed: Apr. 20, 2000

Related U.S. Application Data
(60) Provisional application No. 60/176,909, filed on Jan. 20, 2000.

(51) Int. Cl.[7] .................................................. H01S 5/00
(52) U.S. Cl. ........................................... 372/45; 372/46
(58) Field of Search .................................... 372/45, 46

(56) References Cited

U.S. PATENT DOCUMENTS

| | | | | |
|---|---|---|---|---|
| 4,740,976 A | * | 4/1988 | Kajimura et al. | 372/45 |
| 5,208,822 A | * | 5/1993 | Haus et al. | 372/50 |
| 5,301,202 A | * | 4/1994 | Harder et al. | 372/46 |
| 5,985,686 A | * | 11/1999 | Jayaraman | 438/32 |
| 6,104,738 A | * | 8/2000 | Kitoh et al. | 372/46 |
| 6,175,582 B1 | * | 1/2001 | Naito et al. | 372/45 |

FOREIGN PATENT DOCUMENTS

JP 02074088 A * 3/1990 ............. H01S/3/18

* cited by examiner

*Primary Examiner*—Paul Ip
*Assistant Examiner*—James Menefee
(74) *Attorney, Agent, or Firm*—Fish & Richardson P.C.

(57) ABSTRACT

A semiconductor diode laser has a characteristic output with a single mode vertical far-field divergence. The semiconductor diode laser includes a waveguide with a first refractive index and a quantum well embedded in the center of the waveguide. On one side of the waveguide sits a p-type cladding layer with a second refractive index smaller than the first refractive index. On the other side of the waveguide sits an n-type cladding layer with a third refractive index smaller than the first refractive index and larger than the second refractive index.

29 Claims, 4 Drawing Sheets

SEMICONDUCTOR DIODE LASERS WITH IMPROVED BEAM DIVERGENCE

PRIORITY

This application claims the benefit of U.S. Provisional Application No. 60/176,909, filed Jan. 20, 2000, and which is incorporated herein by reference.

FIELD OF THE INVENTION

The present invention relates to semiconductor diode lasers. In particular, the present invention relates to semiconductor diode lasers with asymmetric bandgaps and refractive indices in the n- and p-type cladding layers.

BACKGROUND

A semiconductor laser diode typically includes a body of a semiconductor material or materials having a waveguide region and a cladding region on each side of the waveguide region. Within the waveguide region is another region, such as a quantum-well region, in which photons are generated when the diode is properly biased by an electrical current. Generally, cladding regions are doped to be of opposite conductivity type from each other, and are of a material having a lower refractive index than the material of the waveguide region so as to attempt to confine the photons to the waveguide region.

Many applications of semiconductor laser diodes benefit from a broad waveguide laser design in which the waveguide thickness W is 3–4 times larger than $W_0$, the waveguide thickness in conventional lasers that provides the maximum overlap of the optical zeroth-order mode with the quantum well region. As disclosed in U.S. Pat. No. 5,818,860, incorporated herein by reference, use of a broad waveguide can minimize overlap of the optical zeroth-order mode with the cladding layer. Waveguide broadening has the dual benefits of maximizing the laser's power output due to decreased absorption in the cladding, and decreasing the probability of catastrophic optical damage of the mirror facet due to near field expansion.

Many applications, in addition to benefiting from a broad waveguide, require single-mode output. For example, semiconductor diode lasers are often used as a pumping source for signal amplification in fiber-optic telecommunication. When the signal amplification relies on erbium doped fiber amplifiers (EDFA), a single-mode laser output has high efficiency of coupling into the amplifier.

The present inventors have found that broadening the waveguide region above a certain material-dependent threshold (e.g., approximately 1 $\mu$m for the materials used by the inventors) can lead to generation of additional optical modes, thereby decreasing the coupling of the laser output into the amplifier. Thus, known diode-laser configurations are limited in both near-field expansion and in vertical (perpendicular to the structure plane) far-field beam divergence narrowing. The former can cause damage to the laser facet when the laser is operated at a desired power, and the latter can decrease the efficiency of coupling the laser output into other devices

SUMMARY OF THE INVENTION

To alleviate the problems in known systems, a high-power semiconductor diode laser having a quantum well or multiple quantum wells substantially in the waveguide center is discussed herein.

Embodiments of the present invention allow for broadening the waveguide beyond that in previously-designed lasers, while maintaining the laser's single-mode properties with improved near-field distribution and far-field divergence. To achieve these results, various embodiments are configured such the refractive-index distribution is asymmetric as measured from the cladding on one side of the waveguide region to the cladding on the other side of the waveguide region (i.e., in the vertical direction). Additionally, embodiments of the present invention include various configurations in which a quantum well is positioned in the center of the waveguide region.

The asymmetry of the refractive index distribution prevents non-zero even modes from lasing in the waveguide region, while the central position of the quantum well prevents odd-modes from lasing in the waveguide region. For the purposes of the present invention, the phrases "non-zero even modes" and "odd modes" represent other higher-order modes excluding the fundamental mode.

The vertical design of the laser can, in one embodiment, provide a far-field beam divergence of approximately 20 degrees, which will readily couple into an EDFA with a core diameter of 4 $\mu$m having a numerical aperture (NA) of 0.2.

In one embodiment of the present invention, a single-mode semiconductor diode laser includes a waveguide region, a p-type cladding layer and an n-type cladding layer. The waveguide region has a first refractive index $n_1$, the p-type cladding layer has a second refractive index $n_2$ smaller than the first refractive index, and the n-type cladding layer has a third refractive index $n_3$ smaller than the first refractive index and larger than the second refractive index. The bandgap difference between the p-type cladding layer and the waveguide region is larger than that between the n-type cladding layer and the waveguide.

DETAILED DESCRIPTION

Embodiments of the present invention provide a semiconductor diode laser vertical structure with improved single mode vertical near-field beam distribution and far-field beam divergence. If desired, embodiments of the invention provide for a semiconductor diode laser with a broad waveguide.

Embodiments of the present invention, as described below, are designed to allow for a far-field divergence that facilitates coupling into a second apparatus. For example, embodiments of the present invention can be used as pumps for EDFA devices, given the appropriate far-field divergence. For the purposes of the present invention, a broad waveguide is a waveguide having a thickness W that is at least approximately three times greater than $W_0$, the waveguide thickness in conventional lasers that provides the maximum optical mode overlapping with the laser's quantum well region.

Figure 1:
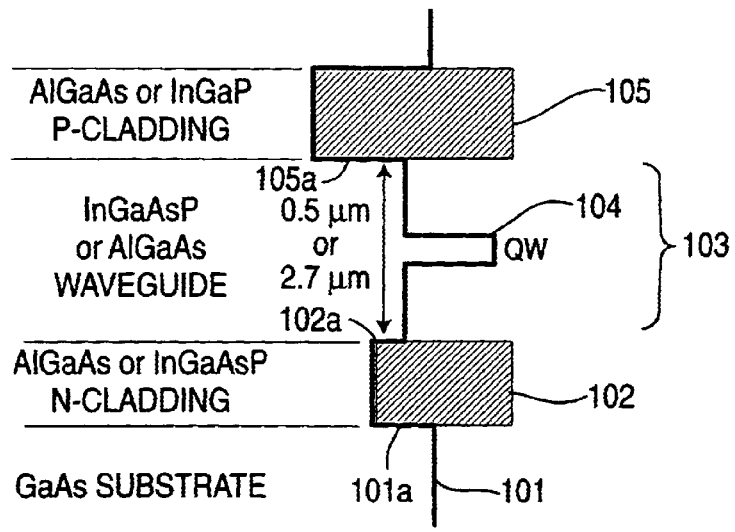
FIG. 1 is a cross-sectional band-gap diagram of an apparatus according to a first embodiment of the present invention.

FIG. 1 is a cross-sectional band-gap diagram of an apparatus according to a first embodiment of the present invention. An example of this embodiment can be a semiconductor diode laser that emits 0.98 $\mu$m radiation so as to couple into an EDFA. The apparatus includes a substrate 101, an n-type cladding 102, a waveguide region 103 that includes quantum wells 104 positioned at the center of the waveguide layer, and a p-type cladding 105. A difference in the bandgap energies 101a exists between the n-type cladding and the substrate, and a difference in the bandgap energies 102a exists between the n-type cladding and the waveguide. In the embodiment represented by FIG. 1, the difference in the bandgap energies 105a between the p-type cladding and the waveguide is greater than the difference in the bandgap energies 102a between the n-type cladding and the waveguide. Additionally, the energy bandgap of layer 102 is greater than energy bandgap of layer 103, but smaller than energy bandgap of layer 105.

In this embodiment of the present invention, substrate 101 is a GaAs compound, n-type cladding 102 is an AlGaAs or InGaAsP compound, waveguide 103 is an InGaAsP or AlGaAs compound, and p-type cladding 105 is an AlGaAs or InGaP compound, quantum wells 104 include InGaAs or InGaAsP compounds. The invention, however, is not limited to these compounds. Rather, the invention can use any compound that is practicable for such devices.

Figure 2:
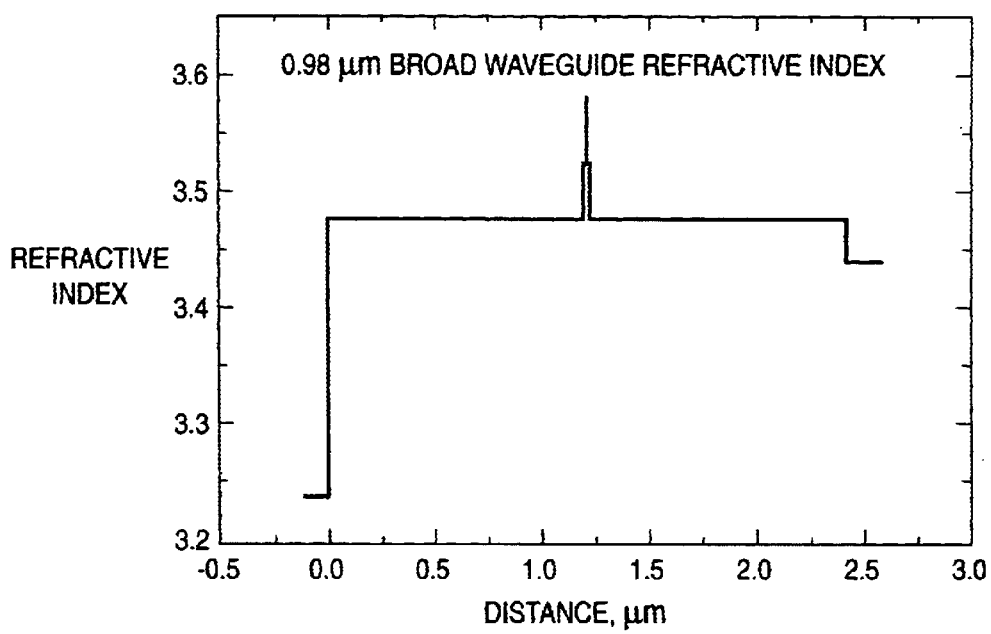
FIG. 2 is a refractive-index diagram of an apparatus according to a first embodiment of the present invention.

FIG. 2 is a refractive-index diagram of an apparatus according to an embodiment of the present invention. As can be seen in FIG. 2, the difference in refractive index between the p-type cladding and the waveguide is greater than the difference in refractive index between the n-type cladding and the waveguide, thus forming an asymmetric optical confinement for propagation of a single-mode beam in the waveguide.

Figure 3:
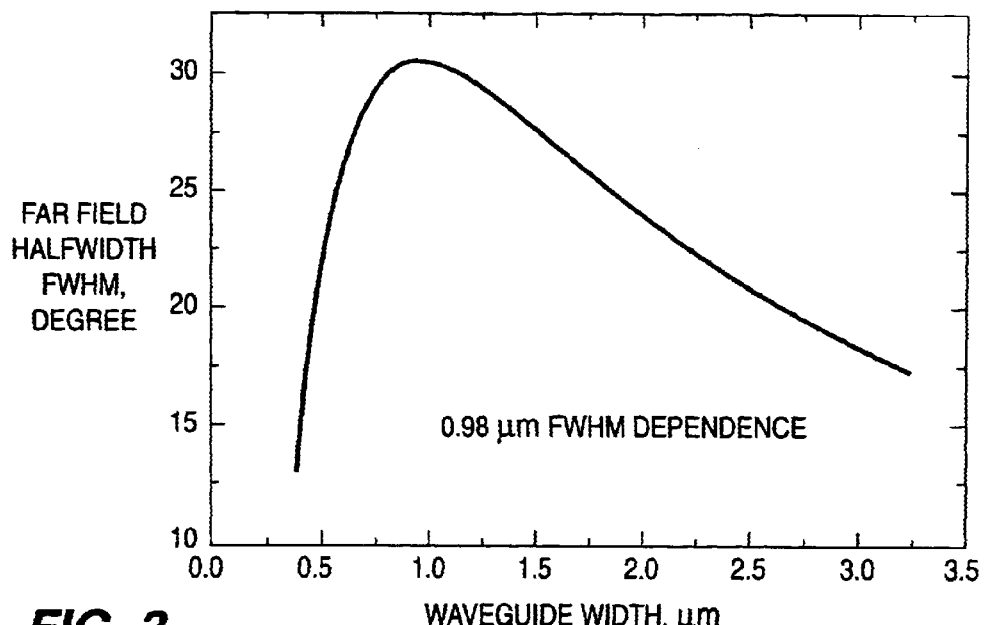
FIG. 3 is a graph of the far field divergence, measured by the full width at half maximum, as a function of waveguide width, according to an embodiment of the present invention.

FIG. 3 is a graphical representation of far-field divergence for the 0.98 $\mu$m embodiment of the present invention, measured by the full width at half maximum (FWHM), as a function of waveguide width for a given set of materials. This figure can be used to design a device with a desired far-field divergence. For example, as can be seen in this figure, if a far-field divergence with a FWHM of 20 degrees is desired, one can make the waveguide either 0.5 $\mu$m or 2.7 $\mu$m wide.

Values of the waveguide thickness that provide 20 degrees vertical divergence depend on the compositions of the claddings and waveguide, but is approximately proportional to the laser's output wavelength. Levels of doping and vertical distribution of the dopants in the cladding should be optimized based upon two conditions. First, device resistance should be minimized. Second, creating additional optical losses that are higher than other types of internal losses caused by scattering on the uniformities and absorption in the active region should be avoided.

The second condition should be considered at least for a design with a modest waveguide thickness, because the optical field penetration into the cladding is very small in the case of asymmetric broad waveguide structures. In the asymmetric structures, the optical field penetrates only in the n-type cladding layers, and the n-doping should be limited by additional optical losses. For p-type cladding, a graded doping of 1–3×10$^{18}$ cm$^{-3}$ can be used.

One skilled in the art will appreciate that the thickness of the cladding regions should be large enough to prevent losses due to optical field penetration into the substrate (or into the contact layer (not shown in the figures)). For example, for the compounds discussed above, a p-type cladding with a thickness of 1 to 1.5 $\mu$m is sufficient. For n-type cladding, the thickness should be different for embodiments that exhibit a broad waveguide (e.g., 2.7 $\mu$m) than for embodiments that exhibit a modestly-thick waveguide (e.g., 0.5 $\mu$m). For broad-waveguide embodiments, the n-type cladding thickness can be the same as the p-type cladding thickness (e.g., ~1 $\mu$m). For a modestly-thick waveguide embodiment, a cladding thickness of 3–4 $\mu$m can be used.

Figure 4:
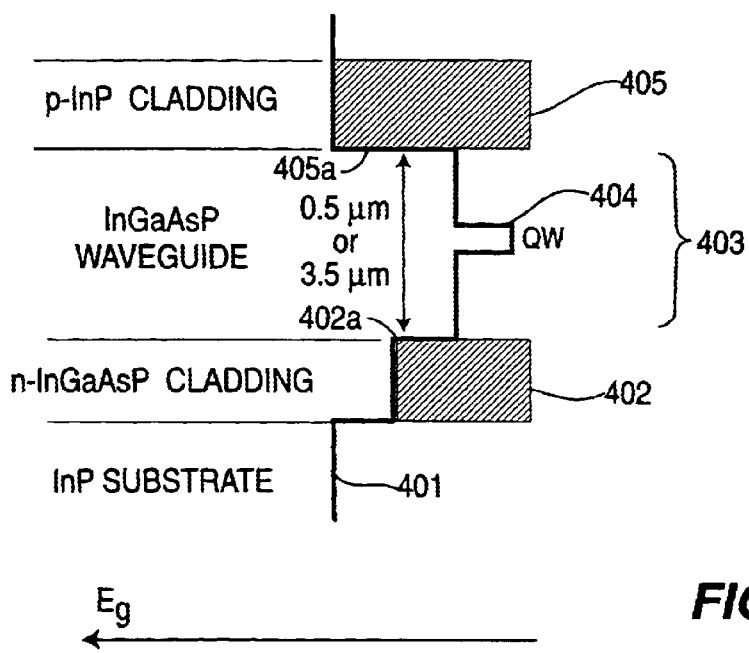
FIG. 4 is a cross-sectional band-gap diagram of an apparatus according to an embodiment of the present invention.

FIG. 4 is a cross-sectional energy band-gap diagram of an apparatus according to an embodiment of the present invention. In this embodiment, the semiconductor diode laser emits 1.48 $\mu$m radiation. In this embodiment, substrate 401 is an InP compound, n-type cladding 402 is an InGaAsP or InGaAlAs compound, waveguide 403 is an InGaAsP or InGaAlAs compound, and p-type cladding 405 is an InP or InAlAs compound. Quantum wells can be InGaAsP or InGaAs or InGaAlAs compounds. As is typically the case, waveguide 403 contains a center-positioned quantum well or wells 404. As with the embodiment of FIG. 1, bandgap difference 402a, between n-type cladding 402 and waveguide 403, is smaller than bandgap difference 405a, between p-type cladding 405 and waveguide 403.

Figure 5:
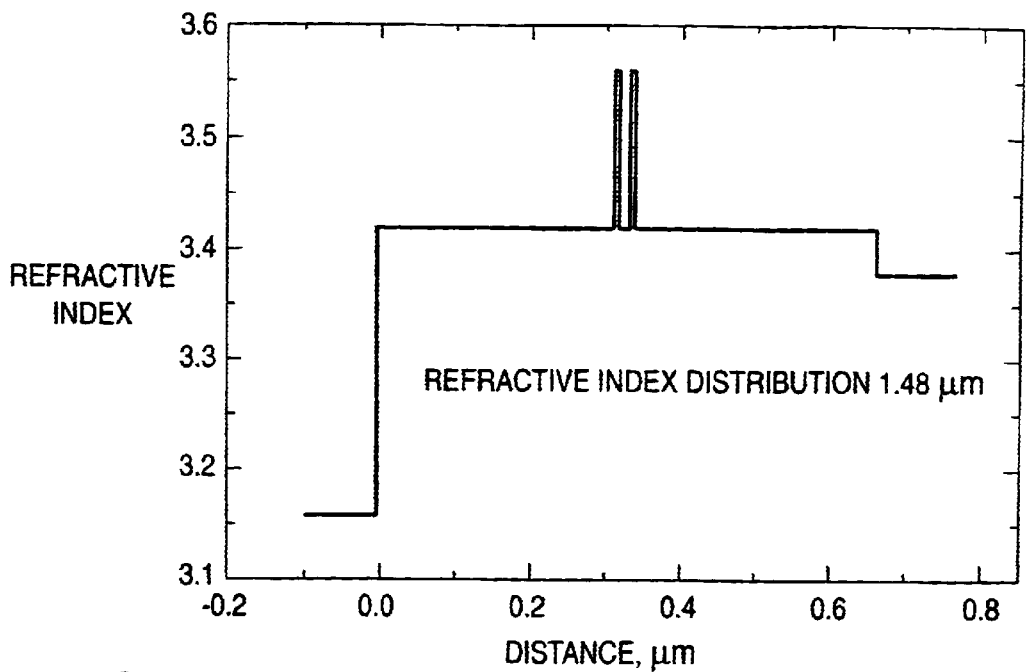
FIG. 5 is a refractive-index diagram of an apparatus according to an embodiment of the present invention.

FIG. 5 is a graph of refractive index as a function of vertical distance in the laser structure for the embodiment shown in FIG. 4, but with two quantum wells. It should be appreciated that, in the present context, the term "vertical" is to be understood in the context of the figure, and is not an absolute direction. In other words, the refractive index is shown in FIG. 5 as a function of distance, left to right, corresponding to the laser structure shown in FIG. 4, bottom to top. As is characteristic of embodiments of the present invention, the difference in refractive index between p-type cladding 405 and waveguide 403 is larger than the difference in refractive index between n-type cladding 402 and waveguide 403.

Figure 6:
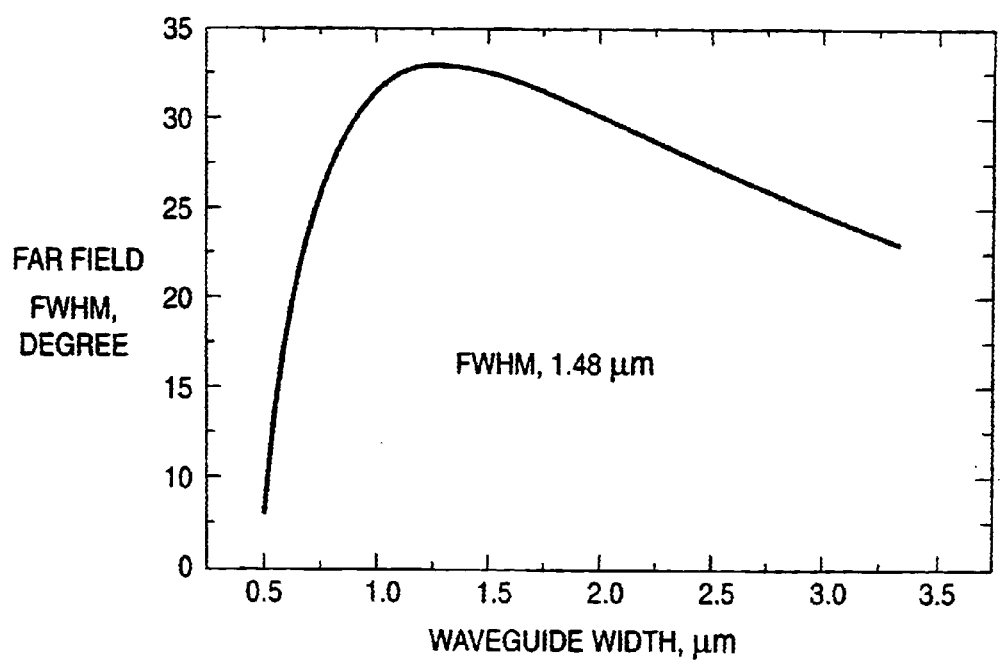
FIG. 6 is a graph of the far-field divergence, measured by the full width at half maximum, as a function of waveguide width, according to an embodiment of the present invention.

Vertical far-field beam divergence in the embodiment of FIGS. 4 and 5 is again a function of waveguide width, as is shown in FIG. 6. As can be seen in this figure, if a far-field divergence with a FWHM of 20 degrees is desired, one can choose a waveguide thickness of either approximately 0.5 $\mu$m (modest waveguide thickness) or 3.5 $\mu$m (broad waveguide).

Figure 7:
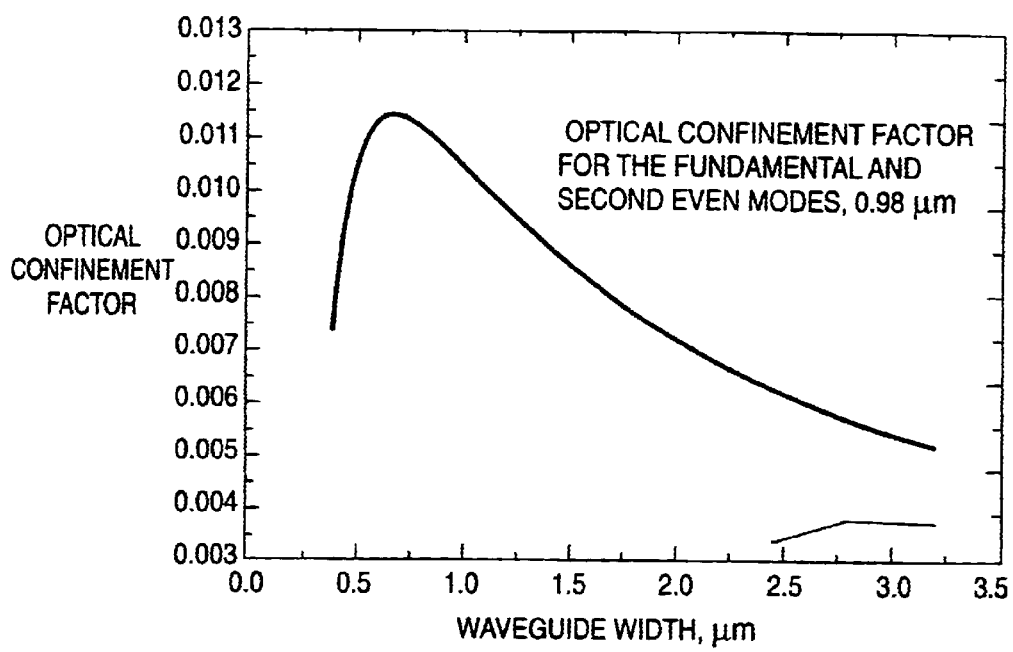
FIG. 7 is a graph of the optical-confinement factor as a function of waveguide width, according to an embodiment of the present invention.
Figure 8:
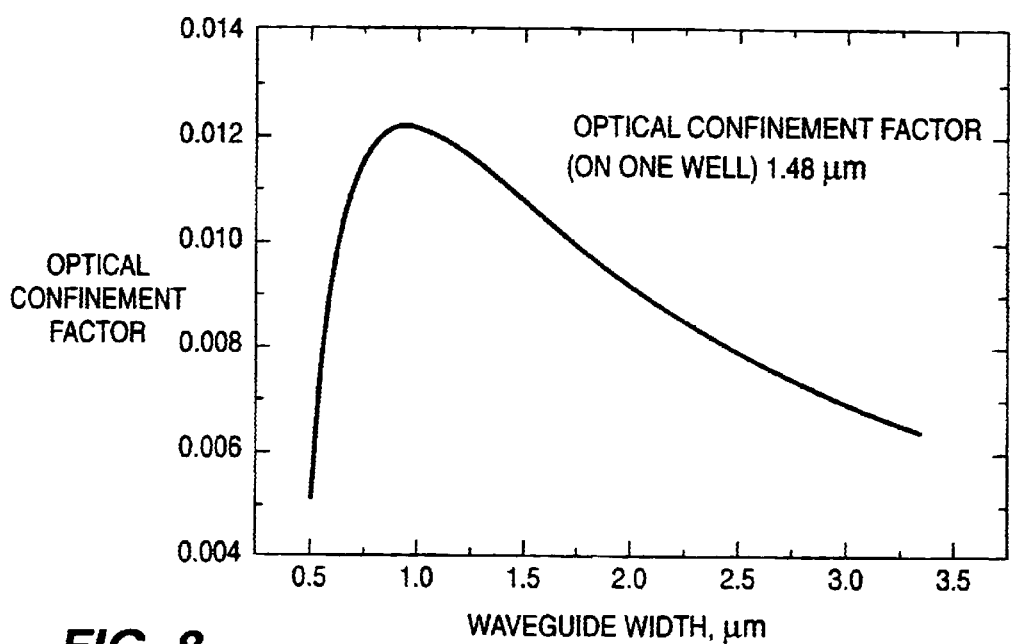
FIG. 8 is a graph of the optical-confinement factor as a function of waveguide width, according to an embodiment of the present invention.

FIGS. 7 and 8 are graphs of the optical-confinement factor as a function of waveguide width. FIG. 7 represents the optical-confinement factor for a 0.98 $\mu$m laser, and FIG. 8 represents the optical-confinement factor for a 1.48 $\mu$m laser. The vertical dashed lines in these figures refer to the waveguide thickness providing approximately 20°–22° vertical divergence. This reduction of the optical confinement is beneficial for high-power operation because the power level at which catastrophic optical damage occurs is inversely proportional to the optical confinement factor. At a waveguide thickness of approximately 2.5 $\mu$m, the optical confinement factor is halved and the maximum output power is expected to be doubled.

Maximizing the asymmetry in the two refractive-index steps (i.e., between the p-type cladding and the waveguide, on the one hand, and between the n-type cladding and the waveguide, on the other hand) allows one to maximize the width of the waveguide that can be used without introducing additional transverse modes in generated laser radiation. The asymmetry in the two refractive-index steps depends on the asymmetry between the two bandgap differences (i.e., the bandgap difference between the p-type cladding and the waveguide, on the one hand, and between the n-type cladding and the waveguide, on the other hand). Thus, maximizing the refractive-index step on the p-type cladding side of the waveguide, while minimizing the refractive-index step on the n-type cladding side of the waveguide, allows for the widest waveguide without introducing non-zero even transverse modes.

The dependence of the maximum waveguide thickness $W_2$ on the refractive indices $n_2$ and $n_3$ is given by equation (1). Of course, this equation gives the theoretical maximum, and in practice the equal sign may not be exactly equal. At selected $n_2$ and $n_3$, the waveguide with a centrally-positioned quantum well having the thickness $W_2$ can provide laser operation in the transverse (vertical) zeroth-order mode, with maximally wide near-field distribution and minimal far-field divergence. The first and other even modes do not exist at $W \leq W_2$. (Again, in practice, this inequality becomes "less than or approximately equal to.") Additionally, odd mode lasing is eliminated by the centered positioning of the quantum wells in the waveguide.

$$W_2 = \frac{\lambda(2\pi + \cos^{-1}\eta)}{2\pi(2n_1(n_1 - n_3))^{0.5}} \quad (1)$$

where $\lambda$ is the radiation wavelength, $n_1$ is the refractive index of the waveguide, $n_3$ is the refractive index of the n-cladding and the $n_2$ is the refractive index of the p-cladding and $$\eta = \sqrt{\frac{(n_1 - n_3)}{(n_1 - n_2)}}$$

The desirable refractive index distribution can be achieved, in one embodiment of the present invention, when the following two criteria are met. First, the p-type cladding layer must be chosen such that the bandgap is maximized. Second, the n-type cladding layer must be chosen such that the n-type cladding has a bandgap that exceeds the waveguide's bandgap by an amount on the order of kT, where k is Boltzman's constant, and T is the temperature of the device during operation.

The present invention has been described in terms of several embodiments solely for the purpose of illustration. Persons skilled in the art will recognize from this description that the invention is not limited to the embodiments described, but may be practiced with modifications and alterations limited only by the spirit and scope of the appended claims. In particular, the present invention has been described in terms of particular embodiments (a 0.98 µm laser and a 1.48 µm laser) for ease of explanation and understanding. Any known practicable materials and their corresponding thicknesses, however, can be used, as long as the functional relationship described above between bandgap, index of refraction, and waveguide thickness satisfies the optical confinement and distribution/divergence criteria discussed above.

What is claimed is:

1. A semiconductor diode laser comprising:
    a waveguide region having a first refractive index and a waveguide thickness, the waveguide region including a first side, and a second side;
    a quantum well located within the waveguide region;
    a p-type cladding layer having a second refractive index smaller than the first refractive index, the p-type cladding layer being disposed on the first side of the waveguide region; and
    an n-type cladding layer having a third refractive index smaller than the first refractive index and larger than the second refractive index, the n-type cladding layer being disposed on the second side of the waveguide region;
    wherein the combination of the waveguide thickness and the indices of refraction of the waveguide region, the p-type cladding layer, and the n-type cladding layer require that a radiation beam emitted by the semiconductor laser diode have a vertical far-field divergence of less than 25 degrees.

2. The semiconductor diode laser of claim 1 wherein the waveguide thickness and the indices of refraction of the waveguide region, the p-type cladding layer, and the n-type cladding layer are selected such that the vertical far-field divergence at full width at half maximum of the emitted radiation beam is less than approximately 25 degrees.

3. The semiconductor diode laser of claim 1 wherein the waveguide thickness and the indices of refraction of the waveguide region, the p-type cladding layer, and the n-type cladding layer are selected such that the vertical far-field divergence at full width at half maximum of the emitted radiation beam is less than approximately 20 degrees.

4. The semiconductor diode laser of claim 1 wherein the waveguide region comprises a broad waveguide region.

5. The semiconductor diode laser of claim 1 wherein a difference between the first refractive index and second refractive index is greater than about three times the difference between the first refractive index and the third refractive index.

6. The semiconductor diode laser of claim 1 wherein the quantum well is located approximately in the center of the waveguide region.

7. The semiconductor diode laser of claim 1 wherein the waveguide region contains multiple quantum wells.

8. The semiconductor diode laser of claim 1 wherein the semiconductor diode laser produces radiation of wavelength $\lambda$, and wherein the waveguide thickness, $W_2$, is governed by the equation $$W_2 \leq [\lambda(2\pi + \cos^{-1}\eta)]/[2\pi(2n_1(n_1 - n_3))^{1/2}]$$

where $n_1$ is the first refractive index, $n_3$ is the third refractive index, and $n_2$ is the second refractive index, and $$\eta = [(n_1 - n_3)/(n_1 - n_2)]^{1/2}.$$

9. The semiconductor diode laser of claim 1 wherein the waveguide thickness and the indices of refraction of the waveguide region, the p-type cladding layer, and the n-type cladding layer are selected such that the radiation beam emitted by the semiconductor laser diode comprises a single-mode radiation beam.

10. The semiconductor diode laser of claim 1 wherein the n-type cladding layer has a bandgap difference with the waveguide region, the bandgap difference being greater than about kT, where k is Boltzmann's constant, and T is a temperature of the waveguide region during operation.

11. The semiconductor diode laser of claim 1 wherein waveguide thickness is between about 0.4 microns and about 0.6 microns.

12. A single-mode semiconductor diode laser comprising:
   a broad waveguide region having a first refractive index and a waveguide thickness, the waveguide region including a first side, and a second side;
   a quantum well located within the broad waveguide region;
   a p-type cladding layer having a second refractive index smaller than the first refractive index, the p-type cladding layer being disposed on the first side of the waveguide region;
   an n-type cladding layer having a third refractive index smaller than the first refractive index and different than the second refractive index, the n-type cladding layer being disposed on the second side of the waveguide region; and
   wherein the combination of the waveguide thickness and the indices of refraction of the waveguide region, the p-type cladding layer, and the n-type cladding layer require that a radiation beam emitted by the semiconductor laser diode have a vertical far-field divergence of less than 25 degrees.

13. The semiconductor diode laser of claim 12 wherein the waveguide thickness and the indices of refraction of the waveguide region, the p-type cladding layer, and the n-type cladding layer are selected such that the vertical far-field divergence at full width at half maximum of the emitted radiation beam is less than approximately 25 degrees.

14. The semiconductor diode laser of claim 12 wherein the waveguide thickness and the indices of refraction of the waveguide region, the p-type cladding layer, and the n-type cladding layer are selected such that the vertical far-field divergence at full width at half maximum of the emitted radiation beam is less than approximately 20 degrees.

15. The semiconductor diode laser of claim 12 wherein the third index of refraction is greater than the second index of refraction.

16. The semiconductor diode laser of claim 12 wherein the third index of refraction is less than the second index of refraction.

17. The semiconductor diode laser of claim 12 wherein the quantum well is located approximately in the center of the waveguide region.

18. The semiconductor diode laser of claim 12 further comprising multiple quantum wells located within the waveguide region.

19. The semiconductor diode laser of claim 12 wherein the semiconductor diode laser produces radiation of wavelength $\lambda$, and wherein the waveguide region has a width $W_2$ governed by the equation $$W_2 \leq [\lambda(2\pi + \cos^{-1}\eta)]/[2\pi(2n_1(n_1-n_3))^{1/2}]$$

where $\lambda$ is the wavelength of the radiation produced by the laser, $n_1$ is the first refractive index, $n_3$ is the third refractive index and the $n_2$ is the second refractive index, and $$\eta = [(n_1-n_3)/(n_1-n_2)]^{1/2}.$$

20. The semiconductor diode laser of claim 12 wherein the waveguide thickness is greater than about 2.2 microns.

21. The semiconductor diode laser of claim 12 wherein the waveguide thickness is greater than about 2.5 microns.

22. The semiconductor diode laser of claim 12 wherein the waveguide thickness is greater than about 3.5 microns.

23. A single-mode semiconductor laser for emitting a beam of radiation having a full vertical far-field divergence comprising:
   an asymmetric cladding structure sandwiching a broad waveguide region having a waveguide thickness and a waveguide refractive index, the asymmetric cladding structure allowing the broad central waveguide to support a single mode for lasing, the asymmetric cladding structure having a first surrounding cladding layer disposed on a first side of the waveguide region and having a first refractive index which is less than the waveguide refractive index, and the asymmetric cladding structure having a second surrounding cladding layer disposed on the second side of the waveguide region and having a second refractive index which is less than the waveguide refractive index and less than the first refractive index, wherein the combination of the waveguide thickness and the indices of refraction of the waveguide region, the p-type cladding layer, and the n-type cladding layer require that a radiation beam emitted by the semiconductor laser diode have a vertical far-field divergence of less than 25 degrees.

24. The semiconductor diode laser of claim 23 wherein the waveguide thickness and the indices of refraction of the waveguide region, the first surrounding cladding layer, and the second surrounding cladding layer are selected such that the vertical far-field divergence at full width at half maximum of the emitted radiation beam is less than approximately 25 degrees.

25. The semiconductor diode laser of claim 23 wherein the waveguide thickness and the indices of refraction of the waveguide region, the first surrounding cladding layer, and the second surrounding cladding layer are selected such that the vertical far-field divergence at full width at half maximum of the emitted radiation beam is less than approximately 20 degrees.

26. The semiconductor diode laser of claim 23 wherein the semiconductor diode laser produces radiation of wavelength $\lambda$, and wherein the waveguide region has a width $W_2$ governed by the equation $$W_2 \leq [\lambda(2\pi + \cos^{-1}\eta)]/[2\pi(2n_1(n_1-n_3))^{1/2}]$$

where $\lambda$ is the wavelength of the radiation produced by the laser, $n_1$ is the first refractive index, $n_3$ is the third refractive index and the $n_2$ is the second refractive index, and $$\eta = [(n_1-n_3)/(n_1-n_2)]^{1/2}.$$

27. The semiconductor diode laser of claim 23 wherein the waveguide thickness is greater than about 2.2 microns.

28. The semiconductor diode laser of claim 23 wherein the waveguide thickness is greater than about 2.5 microns.

29. The semiconductor diode laser of claim 23 wherein the waveguide thickness is greater than about 3.5 microns.

* * * * *